(12) United States Patent
Oh et al.

(10) Patent No.: US 11,262,811 B2
(45) Date of Patent: Mar. 1, 2022

(54) DISPLAY APPARATUS

(71) Applicant: SAMSUNG DISPLAY CO., LTD., Yongin-si (KR)

(72) Inventors: Myong-Soo Oh, Asan-si (KR); Doosan Park, Ansan-si (KR); Hyunchul Jin, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/075,307

(22) Filed: Oct. 20, 2020

(65) Prior Publication Data
US 2021/0247820 A1    Aug. 12, 2021

(30) Foreign Application Priority Data

Feb. 10, 2020  (KR) .................. 10-2020-0015826

(51) Int. Cl.
*G06F 1/00*   (2006.01)
*G06F 1/18*   (2006.01)
*H05K 1/02*   (2006.01)

(52) U.S. Cl.
CPC .............. *G06F 1/183* (2013.01); *G06F 1/189* (2013.01); *H05K 1/028* (2013.01)

(58) Field of Classification Search
CPC .......... G06F 1/183; G06F 1/189; H05K 1/028
See application file for complete search history.

(56) References Cited

U.S. PATENT DOCUMENTS

| | | | |
|---|---|---|---|
| 5,951,304 A * | 9/1999 | Wildes .................. | B81B 7/0006 439/67 |
| 2003/0076308 A1* | 4/2003 | Sano ..................... | G06F 3/0436 345/177 |
| 2008/0119061 A1 | 5/2008 | Hwang et al. | |
| 2008/0119069 A1 | 5/2008 | Ichiyama | |
| 2019/0198473 A1* | 6/2019 | Li .......................... | H01L 24/05 |
| 2019/0245283 A1 | 8/2019 | Oh | |

FOREIGN PATENT DOCUMENTS

| | | |
|---|---|---|
| JP | 2003218492 | 7/2003 |
| JP | 2008130803 | 6/2008 |
| KR | 100881183 | 2/2009 |
| KR | 20190096463 | 8/2019 |

* cited by examiner

*Primary Examiner* — Pete T Lee
(74) *Attorney, Agent, or Firm* — F. Chau & Associates, LLC

(57) ABSTRACT

A display apparatus includes a flexible circuit board including a plurality of first substrate pads and a plurality of second substrate pads, a main circuit board connected to the flexible circuit board, and a display panel including a plurality of first display pads and a plurality of second display pads, where the plurality of first display pads is connected to the main circuit board through the flexible circuit board and each of the plurality of first display pads at least partially overlaps corresponding substrate pad of the plurality of first substrate pads, respectively, and each of the plurality of second display pads at least partially overlaps corresponding substrate pad of the plurality of second substrate pads, respectively.

20 Claims, 10 Drawing Sheets

DISPLAY APPARATUS

CROSS-REFERENCE TO RELATED APPLICATION

This U.S. non-provisional patent application claims priority under 35 U.S.C. § 119 to Korean Patent Application No. 10-2020-0015826, filed on Feb. 10, 2020, the disclosure of which is incorporated by reference herein in its entirety.

TECHNICAL FIELD

The present disclosure relates to a display apparatus, and more particularly, to a display apparatus having a flexible circuit board.

DISCUSSION OF THE RELATED ART

In a display apparatus, a circuit board is connected to a display panel after the display panel is manufactured. For example, a tape automated bonding (TAB) mounting method bonds a flexible circuit board to the display panel by using an anisotropic conductive film (ACF).

SUMMARY

The inventive concept is not limited to the concept described above, and other concepts not described will be apparently understood by those skilled in the art from the following description.

According to an exemplary embodiment of the inventive concept, a display apparatus includes a flexible circuit board including a plurality of first substrate pads arranged in a first direction and a plurality of second substrate pads arranged in the first direction. The plurality of second substrate pads may be spaced apart from the plurality of first substrate pads in a second direction crossing the first direction, and each of the plurality of second substrate pads is disposed alternately to each of the plurality of first substrate pads; a main circuit board connected to the flexible circuit board; and a display panel including a plurality of first display pads and a plurality of second display pads. The plurality of first display pads may be connected to the main circuit board through the flexible circuit board and each of the plurality of first display pads may at least partially overlap corresponding substrate pad of the plurality of first substrate pads, respectively, and each of the plurality of second display pads may at least partially overlap corresponding substrate pad of the plurality of second substrate pads, respectively. Widths of the plurality of first substrate pads and the plurality of second substrate pads in the first direction may increase by an equivalent interval in a direction away from a central axis of the flexible circuit board along the first direction, and spaced distances between neighboring display pads of the plurality of first display pads in the first direction may increase by an equivalent interval in the direction away from the central axis along the first direction, and spaced distances between neighboring display pads of the plurality of second display pads in the first direction may increase by the equivalent interval in the direction away from the central axis along the first direction.

In an embodiment of the inventive concept, width of an area in which each of the plurality of first display pads overlaps corresponding substrate pad of the plurality of first substrate pads may decrease in the direction away from the central axis along the first direction, and in the first direction, width of an area in which each of the plurality of second display pads overlaps corresponding second substrate pad of the plurality of second substrate pads may decrease in the direction away from the central axis along the first direction.

In an embodiment of the inventive concept, in the first direction, widths of the plurality of first substrate pads and the plurality of second substrate pads may be symmetric with respect to the central axis of the flexible circuit board.

In an embodiment of the inventive concept, spaced distances between neighboring substrate pads of the plurality of first substrate pads may decrease in the direction away from the central axis along the first direction, and spaced distances between neighboring substrate pads of the plurality of second substrate pads may decrease in the direction away from the central axis along the first direction.

In an embodiment of the inventive concept, in the first direction, widths of the plurality of first display pads and the plurality of second display pads may be the same as each other.

In an embodiment of the inventive concept, in the first direction, differences between widths of neighboring substrate pads of the plurality of first substrate pads may be the same as each other, and in the first direction, differences between widths of neighboring substrate pads of the plurality of second substrate pads may be the same as each other.

In an embodiment of the inventive concept, each of the plurality of first display pads may have a same width in the first direction, and each of the plurality of second display pads may have a same width in the first direction.

In an embodiment of the inventive concept, the flexible circuit board may include an insulation layer, a plurality of substrate signal lines disposed on the insulation layer, and a solder resist layer in which openings configured to expose a portion of the plurality of substrate signal lines are disposed. Each of the plurality of substrate signal lines may be connected to corresponding substrate pad of the plurality of first substrate pads or corresponding substrate pad of the plurality of second substrate pads through corresponding openings.

In an embodiment of the inventive concept, a distance between a substrate signal line of the plurality of substrate signal lines and a display pad adjacent thereto decreases in the direction away from the central axis along the first direction.

In an embodiment of the inventive concept, each of the plurality of first substrate pads may be connected to corresponding display pad of the plurality of first display pads by an anisotropic conductive film, and each of the plurality of second substrate pads may be connected to corresponding display pad of the plurality of second display pads by another anisotropic conductive film.

According to an exemplary embodiment of the inventive concept, a display apparatus includes a flexible circuit board including a plurality of first substrate pads arranged in a first direction and a plurality of second substrate pads arranged in the first direction, wherein the plurality of second substrate pads is spaced apart from the plurality of first substrate pads in a second direction crossing the first direction, and each of the plurality of second substrate pads is disposed alternately to each of the plurality of first substrate pads; a main circuit board connected to the flexible circuit board; and a display panel including a plurality of first display pads and a plurality of second display pads, where the plurality of first display pads may be connected to the main circuit board through the flexible circuit board and each of the plurality of first display pads may at least partially overlap corresponding substrate pad of the plurality of first substrate pads, respectively, and each of the plurality of second display pads may at least partially overlap corresponding substrate pad of the plurality of second substrate pads, respectively. In the first direction, width of an area in which each of the plurality of first display pads overlaps the corresponding substrate pad of the plurality of first substrate pads, respectively, may decrease in a direction away from a central axis of the flexible circuit board along the first direction, and in the first direction, width of an area in which each of the plurality of second display pads overlaps the corresponding substrate pad of the plurality of second substrate pads, respectively, may decrease in the direction away from the central axis of the flexible circuit board along the first direction.

In an embodiment of the inventive concept, in the first direction, widths of the plurality of first substrate pads and the plurality of second substrate pads may increase by an equivalent interval in the direction away from the central axis of the flexible circuit board along the first direction.

In an embodiment of the inventive concept, in the first direction, widths of the plurality of first substrate pads and the plurality of second substrate pads may be symmetric with respect to the central axis of the flexible circuit board.

In an embodiment of the inventive concept, spaced distances between neighboring substrate pads of the plurality of first substrate pads may decrease in the direction away from the central axis along the first direction, and spaced distances between neighboring substrate pads of the plurality of second substrate pads may decrease in the direction away from the central axis along the first direction.

In an embodiment of the inventive concept, in the first direction, spaced distances between neighboring display pads of the plurality of first display pads may increase by an equivalent interval in a direction away from the central axis along the first direction, and in the first direction, spaced distances between neighboring display pads of the plurality of second display pads may increase by the equivalent interval in a direction away from the central axis along the first direction.

In an embodiment of the inventive concept, in the first direction, differences between widths of neighboring substrate pads of the plurality of first substrate pads may be the same as each other, and in the first direction, differences between widths of neighboring substrate pads of the plurality of second substrate pads may be the same as each other.

In an embodiment of the inventive concept, each of the plurality of first display pads may have a same width in the first direction, and each of the plurality of second display pads may have a same width in the first direction.

In an embodiment of the inventive concept, the flexible circuit board may include an insulation layer, a plurality of substrate signal lines disposed on the insulation layer, and a solder resist layer in which openings configured to expose a portion of the plurality of substrate signal lines are disposed. Each of the plurality of substrate signal lines may be connected to corresponding substrate pad of the plurality of first substrate pads or corresponding substrate pad of the plurality of second substrate pads through corresponding openings.

In an embodiment of the inventive concept, a distance between a substrate signal line and a display pad adjacent thereto may decrease in the direction away from the central axis along the first direction.

In an embodiment of the inventive concept, each of the plurality of first substrate pads is connected to corresponding display pad of the plurality of first display pads by an anisotropic conductive film, and each of the plurality of second substrate pads may be connected to corresponding display pad of the plurality of second display pads by another anisotropic conductive film.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
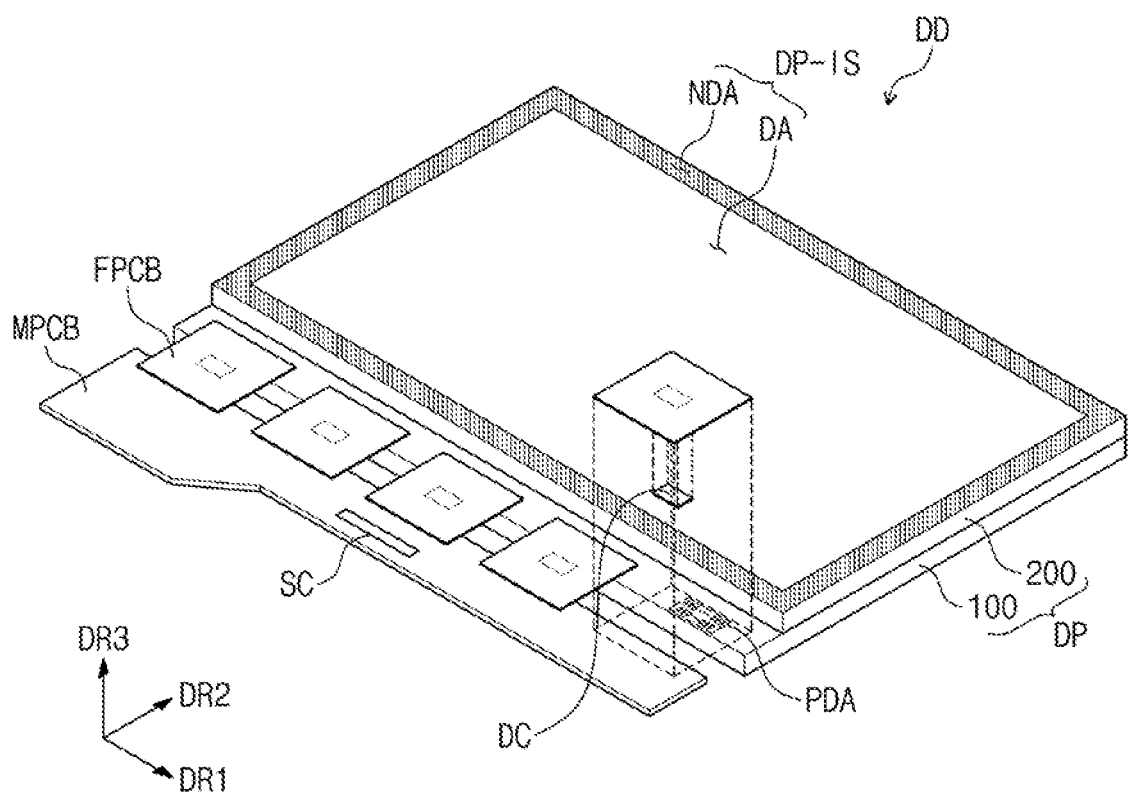
FIG. 1 is a perspective view illustrating a display apparatus according to an exemplary embodiment of the inventive concept.

Herein, it will be understood that when an element of layer is referred to as being "on", "connected to", or "coupled to" another component, it can be directly on, connected or coupled to the other element or layer, or intervening elements or layers may be present.

Like reference numerals may refer to like elements throughout this specification. In the figures, the thickness of layers, films or regions may be exaggerated for clarity.

The term "and/or" includes any and all combinations of one or more of the associated listed items.

It will be understood that although the terms such as "first" and "second" are used herein to describe various elements, these elements should not be limited by these terms. The terms are only used to distinguish one component from other components. For example, a first element referred to as a first element in one embodiment may be referred to as a second element in another embodiment without departing from the scope of the appended claims. The singular forms, "a", "an" and "the" are intended to include the plural forms as well, unless the context clearly indicates otherwise.

Also, ""under", "below", "above', "upper", and the like are used for explaining relational association of components or elements illustrated in the drawings. The terms are intended to be a relative concept and are described based on directions as illustrated in the drawings.

Hereinafter, exemplary embodiments of the present inventive concept will be explained in detail with reference to the accompanying drawings.

Figure 2A:
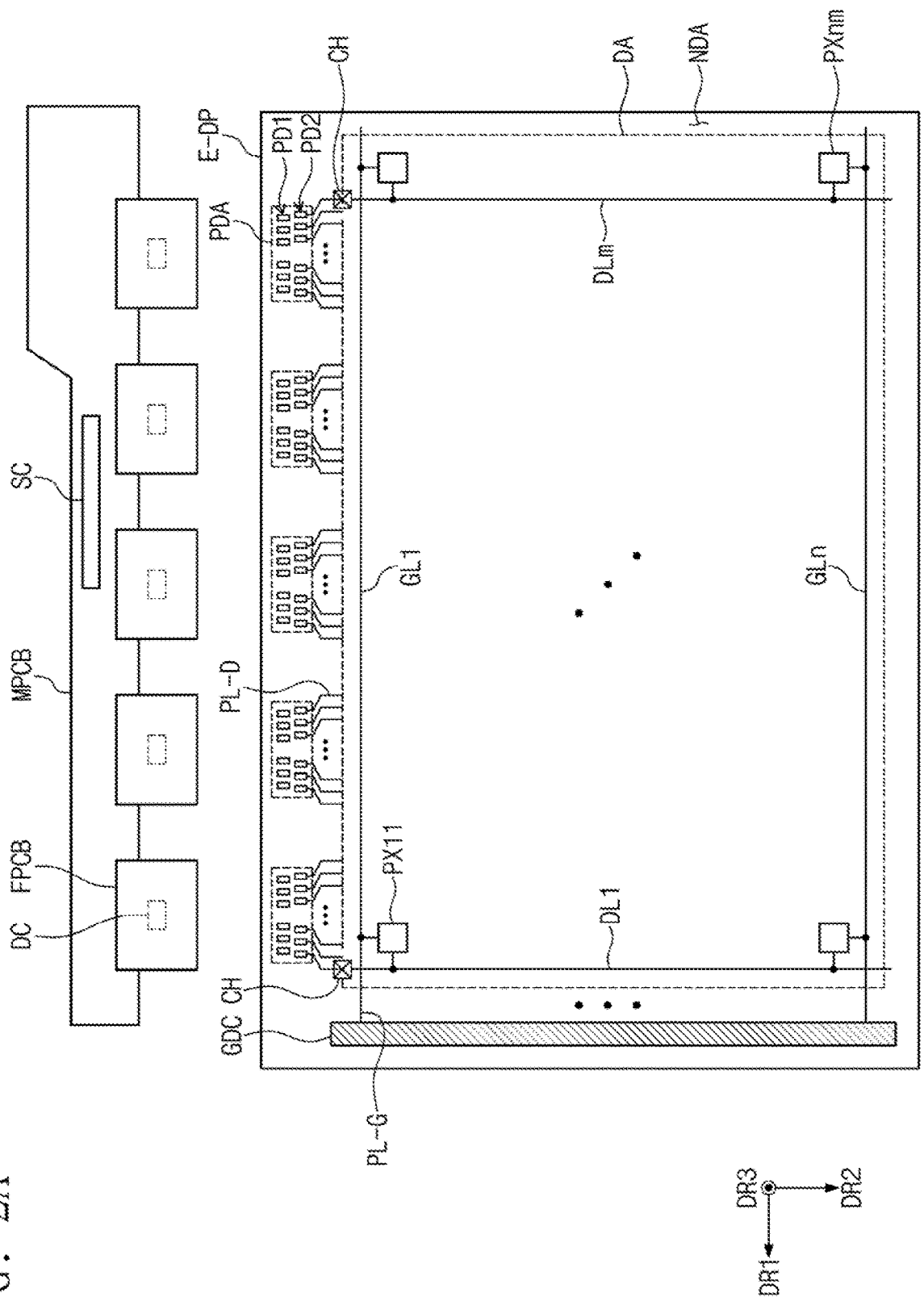
FIG. 2A is a plan view illustrating the display apparatus according to an exemplary embodiment of the inventive concept.
Figure 2B:
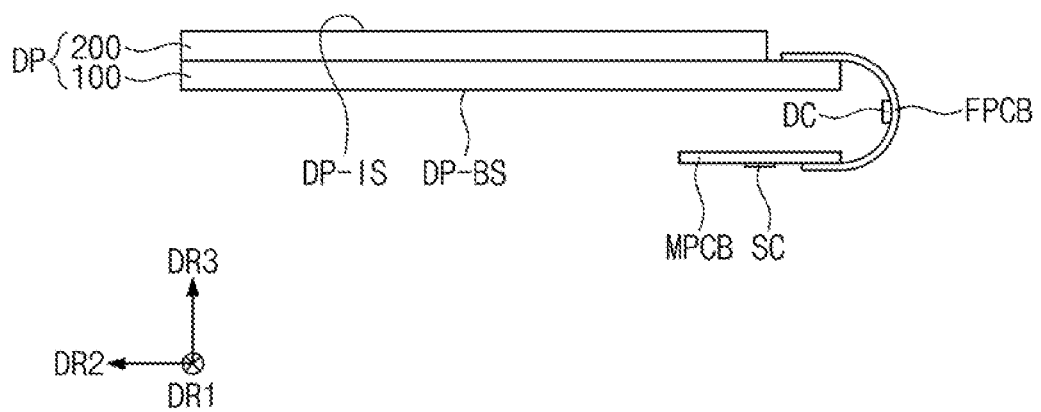
FIG. 2B is a cross-sectional view illustrating the display apparatus according to an exemplary embodiment of the inventive concept.
Figure 3A:
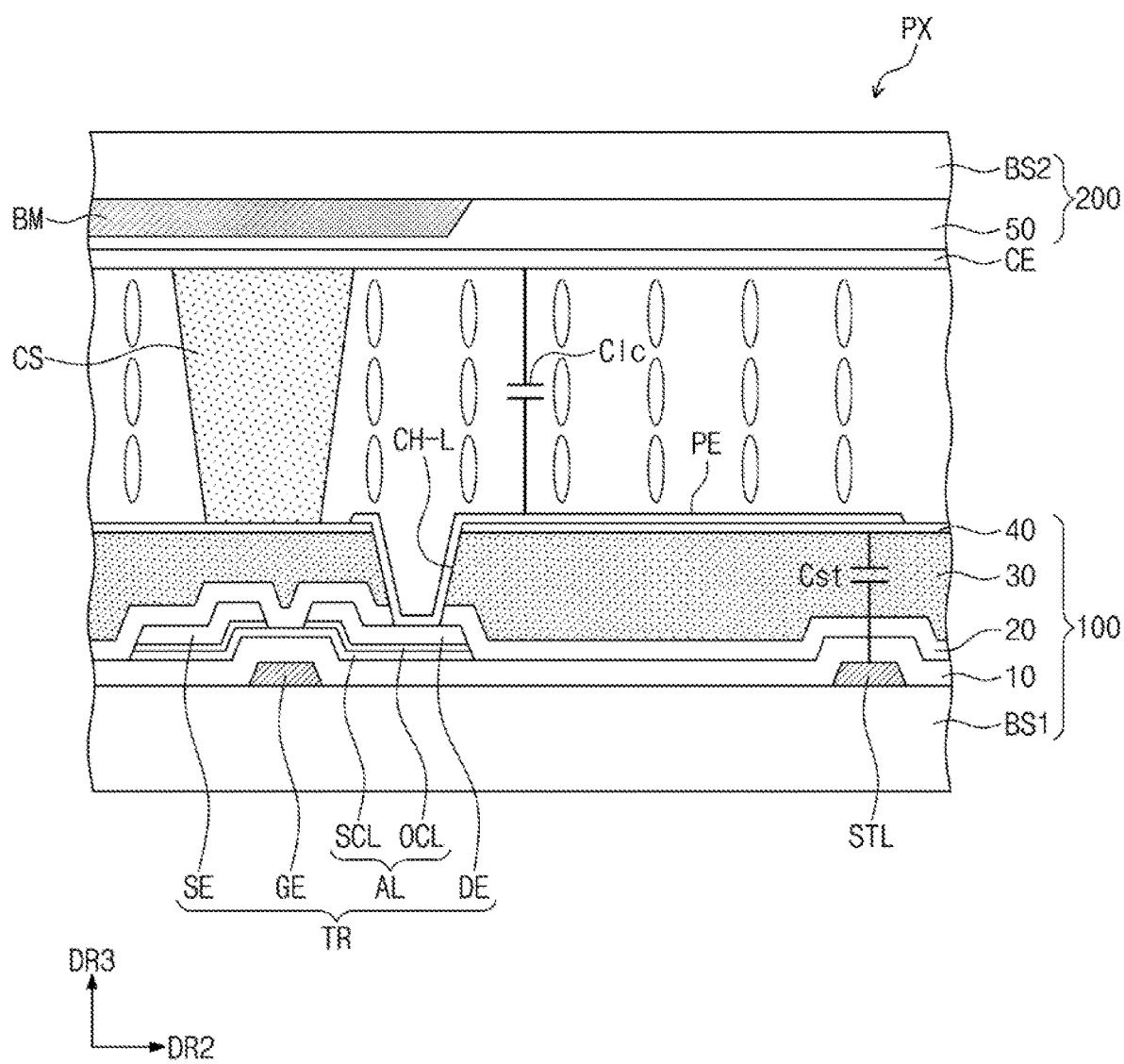
FIG. 3A is a cross-sectional view illustrating a display area of a display panel according to an exemplary embodiment of the inventive concept.
Figure 3B:
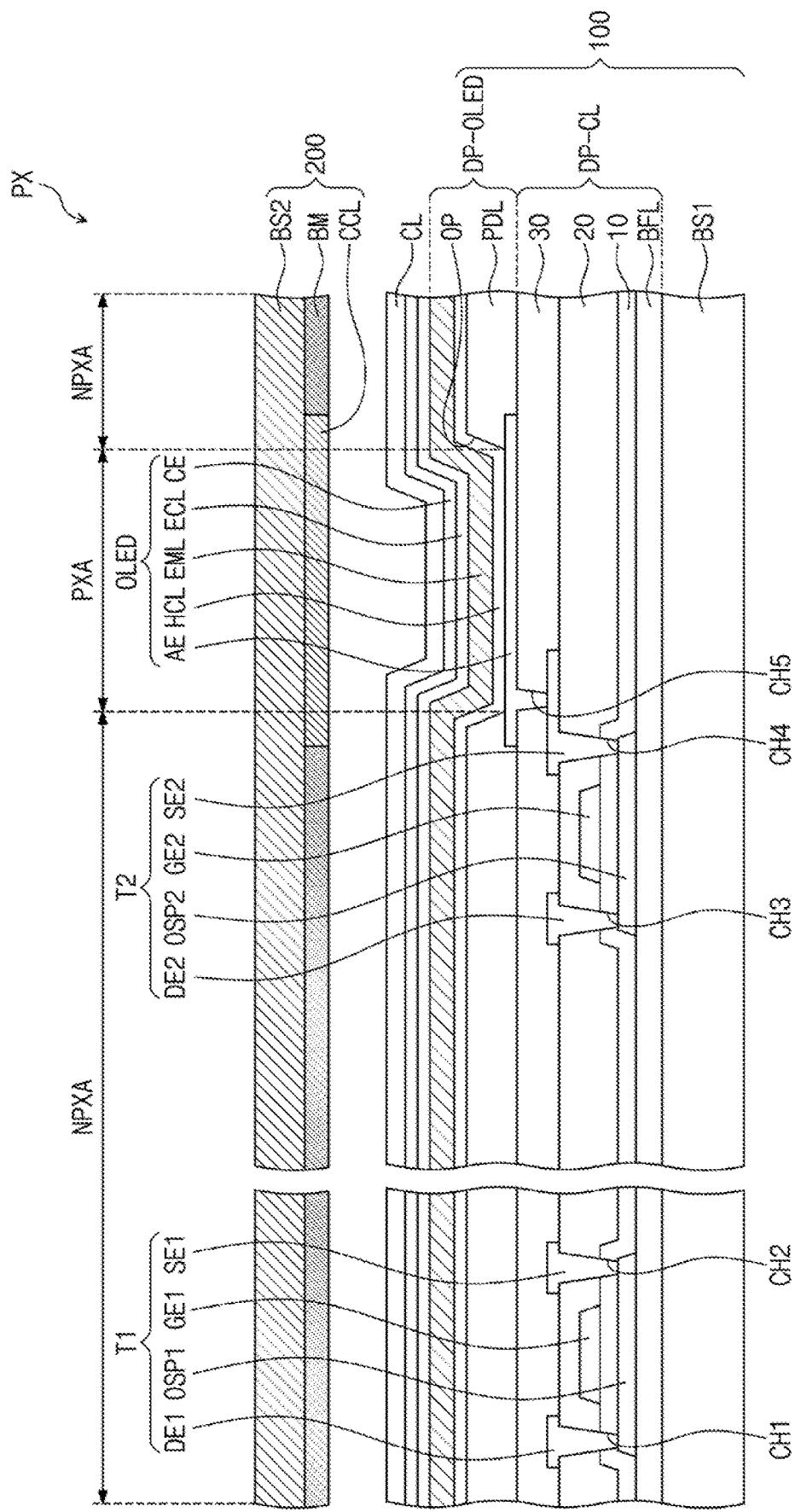
FIG. 3B is a cross-sectional view illustrating the display area of the display panel according to an exemplary embodiment of the inventive concept.

FIG. 1 is a perspective view illustrating a display apparatus according to an embodiment of the inventive concept. FIG. 2A is a plan view illustrating the display apparatus according to an embodiment of the inventive concept. FIG. 2B is a cross-sectional view illustrating the display apparatus according to an embodiment of the inventive concept. FIG. 3A is a cross-sectional view illustrating a display area of a display panel according to an embodiment of the inventive concept. FIG. 3B is a cross-sectional view illustrating the display panel according to an embodiment of the inventive concept.

Referring to FIGS. 1 to 2, a display apparatus DD may include a display panel DP, a flexible circuit board FPCB, and a main circuit board MPCB.

According to an embodiment of the inventive concept, the display apparatus DD may further include a window covering the display panel DP and a chassis member or a molding member coupled with the window to form an appearance of the display apparatus DD.

The display panel DP may be one of a liquid crystal display panel, a plasma display panel, an electrophoretic display panel, a microelectromechanical system (MEMS) display panel), and an electrowetting display panel. When the display panel DP is the liquid crystal display panel, the display apparatus DD may further include a backlight unit disposed below the display panel DP.

The display panel DP may include a first display substrate 100 and a second display substrate 200. The second display substrate 200 may face the first display substrate 100. A gradation display layer may be disposed between the first display substrate 100 and the second display substrate 200. The gradation display layer may include a liquid crystal layer, an organic light emitting layer, and an electrophoretic layer depending on kinds of the display panel DP.

As illustrated in FIG. 1, the display panel DP may display an image through a display surface DP-IS. The display surface DP-IS is parallel to a plane represented by a first directional axis DR1 and a second directional axis DR2. The display surface DP-IS may include a display area DA and a non-display area NDA. The non-display area NDA is disposed along an edge of the display surface DP-IS. The display area DA may be at least partially surrounded by the non-display area NDA. However, embodiments of the inventive concept are not limited thereto. In an embodiment of the inventive concept, the non-display area NDA may be disposed on only one side area adjacent to the flexible circuit board FPCB. That is, the non-display area NDA may not surround all edges of the display area DA.

A perpendicular direction of the display surface DP-IS (i.e., a thickness direction of the display panel DP), indicates a third directional axis DR3. Hereinafter, a front surface (or a top surface) and a rear surface (or a bottom surface) of each of components are distinguished based on the third directional axis DR3. However, the first to third directional axes DR1, DR2, and DR3 in the present disclosure are only exemplarily illustrated. Hereinafter, first to third directions may be directions indicated by the first to third directional axes DR1, DR2, and DR3 and designated by the same reference numerals, respectively.

Although the display panel DP having a flat display surface is illustrated, embodiments of the inventive concept are not limited thereto. In an embodiment of the inventive concept, the display apparatus DD may include a curved display surface or a three-dimensional display surface. The three-dimensional display surface may include a plurality of display areas indicating different directions from each other.

A signal control unit SC may be mounted onto the main circuit board MPCB. The signal control unit SC may be spaced apart from the flexible circuit board FPCB in the second direction DR 2. The signal control unit SC receives image data and control signals from an external graphic control unit. The signal control unit SC may provide a control signal to the display panel DP.

The flexible circuit board FPCB may be connected to each of a display pad area PDA of the display panel DP and a main pad area of the main circuit board MPCB. A conductive adhesive member may include an anisotropic conductive film (ACF). Hereinafter, the conductive adhesive member may be referred to as the anisotropic conductive film (ACF).

In an exemplary embodiment of the inventive concept, the display apparatus DD may include a plurality of the flexible circuit boards FPCB. For example, the flexible circuit boards FPCB may be spaced apart from each other in the first direction DR1. However, embodiments of the inventive concept are not limited thereto. In one embodiment of the inventive concept, the flexible circuit board FPCB may include two types of flexible circuit boards, which at least partially overlap each other.

According to an embodiment, the display pad area PDA may be disposed on the first display substrate 100. However, embodiments of the inventive concept are not limited thereto. In an embodiment of the inventive concept, the display pad area PDA may be disposed on the second display substrate 200.

The flexible circuit board FPCB may include a driving chip DC. The flexible circuit board FPCB may transmit a signal from the main circuit board MPCB to the driving chip DC and a signal from the driving chip DC to the display panel DP. In an embodiment, the driving chip DC may be a data driving circuit. According to an embodiment of the inventive concept, the flexible circuit board FPCB may transmit a signal provided from the signal control unit SC to the display panel DP.

FIG. 2A is a plan view illustrating a planar arrangement relationship between signal lines GL1 to GLn, DL1 to DLm, PL-G, and PL-D and pixels PX11 to PXnm. The signal lines GL1 to GLn, DL1 to DLm, PL-G, and PL-D may include a plurality of gate lines GL1 to GLn, a plurality of data lines DL1 to DLm, and auxiliary signal lines PL-G and PL-D.

The plurality of gate lines GL1 to GLn may be arranged in the second direction DR2 while extending in the first direction DR1, and the plurality of data lines DL1 to DLm may cross the plurality of gate lines GL1 to GLn in an insulating manner. The gate fines GL1 to GLn and the data lines DL1 to DLm may overlap each other. The auxiliary signal lines PL-G and PL-D may overlap the non-display area NDA and are connected to corresponding gate lines GL1 to GLn and corresponding data lines DL1 to DLm.

Second auxiliary signal lines PL-D connected to the data lines DL1 to DLm may be disposed on a different layer from the plurality of data lines DL1 to DLm. The data lines DL1 to DLm may be electrically connected to corresponding second auxiliary signal lines PL-D through a corresponding contact hole CH, respectively. The contact hole CH may pass through at least one insulation layer disposed between the data lines DL1 to DLm and the second auxiliary signal lines PL-D. In FIG. 2A, two contact holes CH are exemplarily illustrated. Embodiments of the inventive concept are not limited to two contact holes CH.

In an embodiment of the inventive concept, the contact hole CH may be optional and omitted. Alternatively, the data lines DL1 to DLm and the second auxiliary signal lines PL-D may be disposed on the same layer. A data line and a second auxiliary signal line, which are connected to each other, among the data lines DL1 to DLm and the second auxiliary signal lines PL-D may be referred to as one signal line. The data line and the second auxiliary line, which are connected to each other, may represent different portions of the one signal line. For example, the data line may form a portion of the one signal line. The second auxiliary line connected to the data line may form the other portion of the one signal line.

The pixels PX11 to PXnm may be disposed on the display area DA. The pixels PX11 to PXnm may not be disposed on the non-display area NDA. Each of the pixels PX11 to PXnm is connected to a corresponding gate line of the plurality of gate lines GL1 to GLn and a corresponding data line of the plurality of data lines DL1 to DLm. Each of the pixels PX11 to PXnm may include a pixel driving circuit and a display device.

According to an embodiment of the inventive concept, the pixels PX11 to PXnm may be arranged in a matrix-type shape (illustrated in FIG. 2A). However, embodiments of the inventive concept are not limited thereto. The pixels PX11 to PXnm may be arranged in a diamond shape, and in this case, an arrangement structure of the pixels PX11 to PXnm may be referred to as a pentile structure.

As illustrated in FIG. 2A, two pad rows PD1 and PD2 may be disposed on each of the display pad areas PDA. Each of the two pad rows PD1 and PD2 may include a plurality of display pads arranged in the first direction DR. A first display pad row PD1 may be spaced apart from a second display pad row PD2 in the second direction DR2 crossing the first direction DR1. The second display pad row PD2 may be spaced further than the first display pad row PD1 from an edge E-DP of the display panel DP and disposed adjacent to the display area DA more than the first display pad row PD1 in the second direction DR2. The first display pad row PD1 may include multiple display pads, which may be referred to as first display pads. The second display pad row PD2 may include multiple display pads, which may be referred to as second display pads. The first display pads disposed in the first display pad row PD1 and the second display pads disposed in the second display pad row PD2 may be disposed alternately to each other. The pads of the first display pad row PD1 and the second display pad row PD2 may be connected to corresponding second auxiliary signal lines PL-D, respectively.

A gate driving circuit GDC may be integrated to the display panel DP through an oxide silicon gate driver circuit (OSG) or amorphous silicon gate driver circuit (ASG) process. The first auxiliary signal lines PL-G may receive a gate signal from the gate driving circuit GDC.

Referring to FIG. 2B, according to an embodiment of the inventive concept, the flexible circuit board FPCB may be bent with a predetermined curvature toward a rear surface DP-BS of the display panel DP. The main circuit board MPCB may be disposed on the rear surface DP-BS of the display panel DP.

FIGS. 3A and 3B are cross-sectional views illustrating the display area DA of the display panel DP according to an embodiment of the inventive concept. FIG. 3A illustrates a cross-sectional view corresponding to a pixel PX of a liquid crystal display panel, and FIG. 3B illustrates a cross-sectional view corresponding to a pixel PX of an organic light emitting display panel.

Referring to FIG. 3A, according to an embodiment of the inventive concept, a gradation display layer of the display panel DP may include a liquid crystal layer. Thus, the display panel DP may be a liquid crystal display panel. When the display panel DP is the liquid crystal display panel, the display apparatus may further include a backlight unit disposed below the display panel DP.

The pixel PX of the liquid crystal display panel may include a transistor TR, a liquid crystal capacitor C1c, and a storage capacitor Cst.

The transistor TR may include a control electrode GE connected to the gate line, an activation part AL overlapping the control electrode GE, an input electrode SE connected to the data line, and an output electrode DE spaced apart from the input electrode SE. The liquid crystal capacitor C1c may include a pixel electrode PE and a common electrode CE. The storage capacitor Cst includes the pixel electrode PE and a portion of a storage line STL overlapping the pixel electrode PE.

The control electrode GE and the storage line STL may be disposed on one surface (e.g., upper surface) of a first base substrate BS1. The first base substrate BS1 may be one of a glass substrate, a plastic substrate, and a substrate including polyimide (PI). A first insulation layer 10 covering the control electrode GE and the storage line STL may be disposed on the one surface of the first base substrate BS1. The first insulation layer 10 may include at least one of an inorganic material and an organic material.

The activation part AL overlapping the control electrode GE may be disposed on the first insulation layer 10. The activation part AL may include a semiconductor layer SCL and an ohmic contact layer OCL. The semiconductor layer SCL may be disposed on the first insulation layer 10, and the ohmic contact layer OCL may be disposed on the semiconductor layer SCL.

The semiconductor layer SCL may include amorphous silicon or poly-silicon. The semiconductor layer SCL may also include a metal oxide semiconductor. The ohmic contact layer OCL may include a dopant that is doped with a density higher than the semiconductor layer. The ohmic contact layer OCL may include two portions spaced apart from each other. In an embodiment of the inventive concept, the ohmic contact layer OCL may have an integrated shape.

The output electrode DE and the input electrode SE may be disposed on the activation part AL. The output electrode DE and the input electrode SE may be spaced apart from each other. A second insulation layer 20 covering the activation part AL, the output electrode DE, and the input electrode SE is disposed on the first insulation layer 10. A third insulation layer 30 may be disposed on the second insulation layer 20. Each of the second insulation layer 20 and the third insulation layer 30 may include at least one of an inorganic material and an organic material. The third insulation layer 30 is disposed on the second insulation layer 20. The third insulation layer 30 may be a single layered organic layer that provides a flat surface. In an embodiment of the inventive concept, the third insulation layer 30 may include a plurality of color filters. A fourth insulation layer 40 may be disposed on the third insulation layer 30. The fourth insulation layer 40 may be an inorganic layer covering the color filters.

As illustrated in FIG. 3A, the pixel electrode PE may be disposed on the fourth insulation layer 40. The pixel electrode PE may be connected to the output electrode DE through a contact bole CH-L passing through the second insulation layer 20, the third insulation layer 30, and the fourth insulation layer 40. An alignment layer covering the pixel electrode PE may be disposed on the fourth insulation layer 40.

The second base substrate BS2 may be one of a glass substrate, a plastic substrate, and a substrate including polyimide (PI). A black matrix layer BM may be disposed on a bottom surface of the second base substrate BS2. That is, openings corresponding to pixel areas may be disposed in the black matrix layer BM. A spacer CS may be disposed to at least partially overlap the black matrix layer BM.

Insulation layers covering the black matrix layer BM is disposed on the bottom surface of the second base substrate BS2. In FIG. 3A, a fifth insulation layer 50 providing a flat surface is exemplarily illustrated. According to an embodiment of the inventive concept, the fifth insulation layer 50 may at least partially surround or overlap the black matrix layer BM. The fifth insulation layer 50 may include an organic material.

The common electrode CE may be disposed on the bottom surface of the second base substrate BS2. According to an embodiment of the inventive concept, the common electrode CE may be disposed on the bottom surface of the fifth insulation layer 50. A common voltage may be applied to the common electrode CE. The common voltage has a value different from a pixel voltage.

The cross-sectional view of the pixel PX in FIG. 3A is exemplarily illustrated. The first display substrate 100 and the second display substrate 200 may be turned over in the third direction DR3. In an embodiment of the inventive concept, the color filters may be disposed on the second display substrate 200.

Referring to FIG. 3A, the liquid crystal display panel in a vertical alignment (VA) mode is described. However, according to some embodiments of the inventive concept, a liquid crystal display panel in a in-plane switching (IPS) mode, a fringe-field switching (FFS) mode, a plane to line switching (PLS) mode, a super vertical alignment (SVA) mode, or a surface-stabilized vertical alignment (SS-VA) mode may be applied as well.

Referring to FIG. 3B, according to an embodiment of the inventive concept, the gradation display layer of the display panel DP may include an organic light emitting layer. Thus, the display panel DP may be an organic light emitting display panel. A pixel PX of the organic light emitting display panel may include a switching transistor T1, a driving transistor T2, and a light emitting device OLED.

The organic light emitting display panel may include a display substrate 100 and an encapsulation substrate 200. The display substrate 100 may include a first base substrate BS1, a circuit device layer DP-CL disposed on the first base substrate BS1, a display device layer DP-OLED disposed on the circuit device layer DP-CL, and a cover layer CL disposed on the display device layer DP-OLED. The encapsulation substrate 200 may include a second base substrate BS2, a black matrix layer BM disposed on a bottom surface of the second base substrate BS2, and a color conversion layer CCL. According to an embodiment of the inventive concept, the black matrix layer BM may include portions spaced part from one another. Further, the color conversion layer CCL may be disposed between two portions of the black matrix layer BM.

The first base substrate BS1 may be one of a glass substrate, a plastic substrate, and a substrate including polyimide (PI). The circuit device layer DP-CL may include at least one insulation layer and a circuit device. The circuit device may include a signal line and a driving circuit of a pixel. The circuit device layer DP-CL may be provided through a process of providing an insulation layer, a semiconductor layer, and a conductive layer by coating or deposition and a process of patterning the insulation layer, the semiconductor layer, and the conductive layer by a photolithography process.

In an embodiment of the inventive concept, the circuit device layer DP-CL may include a buffer layer BFL, a first insulation layer 10, a second insulation layer 20, and a third insulation layer 30. Each of the first insulation 10 and the second insulation layer 20 may be an inorganic layer, and the third insulation layer 30 may be an organic layer.

FIG. 3B exemplarily illustrates an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which constitute the switching transistor T1 and the driving transistor T2. First to fourth through-holes CH1, CH2, CH3, and CH4 are also exemplarily illustrated.

The display device layer DP-OLED may include the light emitting device OLED. The display device layer DP-OLED may include an organic light emitting diode as a light emitting device. The display device layer DP-OLED may include a pixel defining layer PDL. For example, the pixel defining layer PDL may be an organic layer.

A first electrode AE may be disposed on the third insulation layer 30. The first electrode AE may be connected to the second output electrode SE2 through a fifth contact hole CH5 passing through the third insulation layer 30. A light emitting opening OP may be disposed in the pixel defining layer PDL. The light emitting opening OP of the pixel defining layer PDL may expose at least a portion of the first electrode AE.

As illustrated in FIG. 3B, the display panel DP may include a light emitting area PXA and a non-light emitting area NPXA disposed adjacent to the light emitting area PXA. The non-light emitting area NPXA may surround the light emitting area PXA. In an embodiment of the inventive concept, the light emitting area PXA may be defined in correspondence to a partial area of the first electrode AE, which is exposed by the light emitting opening OP. The light emitting area PXA may overlap at least partially the first electrode AE.

A hole control layer HCL may be disposed in common on the light emitting area PXA and the non-light emitting area NPXA. The hole control layer HCL may further include a hole transport layer and a hole injection layer. A light emitting layer EML may be disposed on the hole control layer HCL. The light emitting layer EML may be disposed in common on the light emitting area PXA and the non-light emitting area NPXA. In an embodiment of the inventive concept, the light emitting layer EML may be disposed on the light emitting area PXA and may not be disposed on the non-light emitting area NPXA. The light emitting layer EML may include an organic material and/or an inorganic material. The light emitting layer EML may generate predetermined first color light, e.g., blue light.

An electron control layer ECL may be disposed on the light emitting layer EML. The electron control layer ECL may include an electron transport layer and an electron injection layer. The hole control layer HCL and the electron control layer ECL may be provided in common to the plurality of pixels by using an open mask. A second electrode CE may be disposed on the electronic control layer ECL. The second electrode CE may be disposed in common on the plurality of pixels. The cover layer CL protecting the second electrode CE may be disposed on the second electrode CE. The cover layer CL may include an organic material or an inorganic material.

The second base substrate BS2 may be spaced apart from the cover layer CL. The second base substrate BS2 may be one of a glass substrate, a plastic substrate, and a substrate including polyimide (PI). The color conversion layer CCL may transmit first color light or covert the first color light into second color light or third color light according to the pixel PX. The color conversion layer CCL may include a quantum dot.

In an embodiment of the inventive concept, at least a portion of the encapsulation substrate 200 may be replaced by a thin-film encapsulation layer. The black matrix layer BM and the color conversion layer CCL may be disposed on one surface of the thin-film encapsulation layer. The thin-film encapsulation layer may include an organic layer and at least one inorganic layer sealing the organic layer.

Figure 4A:
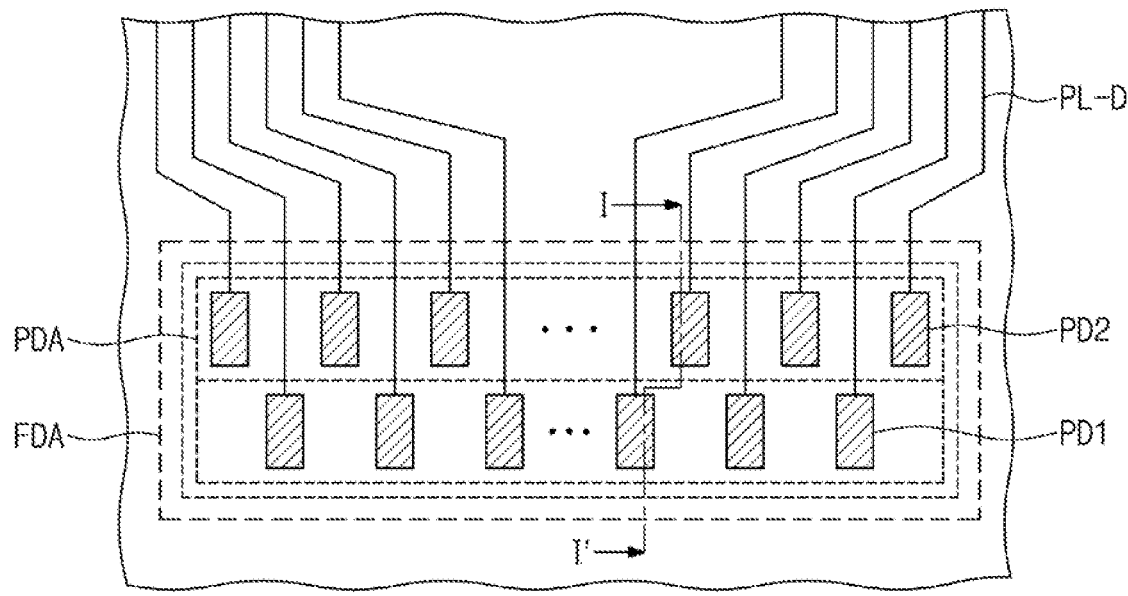
FIG. 4A is an enlarged plan view illustrating a portion of the display apparatus according to an exemplary embodiment of the inventive concept.
Figure 4A:
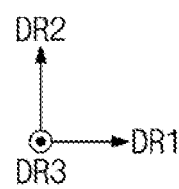
Figure 4B:
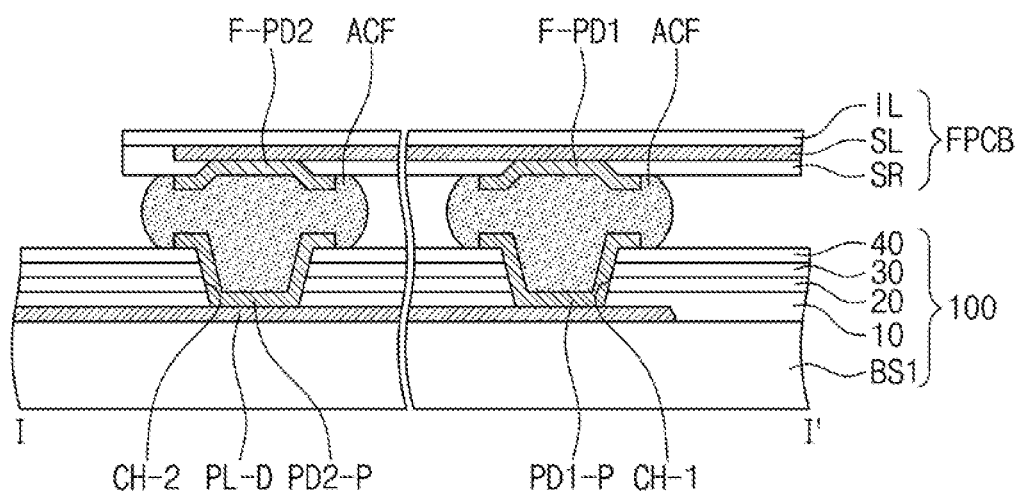
FIG. 4B is a cross-sectional view taken along line I-I' of FIG. 4A.

FIG. 4A is an enlarged plan view illustrating a portion of the display apparatus according to an embodiment of the inventive concept. FIG. 4B is a cross-sectional view taken along line I-I' of FIG. 4A. The same or similar elements as those in FIGS. 1 to 3B will be designated by the same or similar reference numerals, respectively, and to the extent that a description of an element has been omitted, it may be assumed that the description is at least similar to that of corresponding elements that have been described elsewhere in the instant specification.

In FIG. 4A, the display pad area PDA contained in the display panel DP and a substrate pad area FDA of the flexible circuit board FPCB (refer to FIG. 1), which is connected to the display pad area PDA, are illustrated by a dotted line, respectively. Each of the display pad areas PDA and the substrate pad areas FDA may include a plurality of pads. According to an exemplary embodiment of the inventive concept, the display pad area PDA may include a plurality of display pads, and the substrate pad area FDA may include a plurality of substrate pads corresponding to the plurality of display pads, respectively. According to an exemplary embodiment of the inventive concept, each of the plurality of display pads may correspond to one respective substrate pad of the plurality of substrate pads.

Two pad rows PD1 and PD2 may be disposed on each of display pad areas PDA. Each of the two pad rows PD1 and PD2 may include a plurality of display pads arranged in the first direction DR1. A first display pad row PD1 may be spaced apart from a second display pad row PD2 in the second direction DR2 crossing the first direction DR1. First display pads disposed in the first display pad row PD1 and second display pads disposed in the second display pad row PD2 may be disposed alternately to each other. The display pads of the first display pad row PD1 and the second display pad row PD2 may be connected to corresponding second auxiliary signal lines PL-D, respectively.

The first display substrate 100 in FIGS. 4A and 4B is illustrated with respect to the liquid crystal display panel in FIG. 3A.

Referring to FIG. 4B, according to an embodiment of the inventive concept, display pads PD1-P and PD2-P may be connected to different auxiliary signal lines PL-D through contact holes CH-1 and CH-2 passing through the first to fourth insulation layers 10 to 40. Each of a first display pad PD1-P and a second display pad PD2-P is exposed from the first to fourth insulation layers 10, 20, 30, 40. When the display pads PD1-P and PD2-P are omitted, an end of each of the auxiliary signal lines PL-D may be exposed from the first to fourth insulation layers 10 to 40.

The flexible circuit board FPCB may include an insulation layer IL, a substrate signal line SL, a solder resist layer SR, and substrate pads F-PD1 and F-PD2.

Openings exposing at least a portion of the substrate signal line SL may be disposed in the solder resist layer SR. A first substrate pad F-PD1 and a second substrate pad F-PD2 may be connected to different substrate signal lines SL exposed by the openings of the solder resist layer SR, respectively. According to an embodiment of the inventive concept, each of the substrate signal lines SL may be connected to corresponding substrate pad of the first substrate pads or corresponding substrate pad of the second substrate pads through corresponding openings. The display pads PD1-P and PD2-P may be electrically connected to corresponding substrate pads F-PD1 and F-PD2 through an anisotropic conductive film ACF. According to an embodiment of the inventive concept, each of the first substrate pads may be connected to corresponding display pad of the first display pads by an anisotropic conductive film ACF. In addition, each of the second substrate pads may be connected to corresponding display pad of the second display pads by another anisotropic conductive film ACF. As illustrated in FIG. 4B, according to an embodiment of the inventive concept, the display pad PD1-P may be electrically connected to the substrate pad F-PD1 through an anisotropic conductive film ACF. The display pad PD2-P may be electrically connected to the substrate pad F-PD2 through another anisotropic conductive film ACF.

Figure 5A:
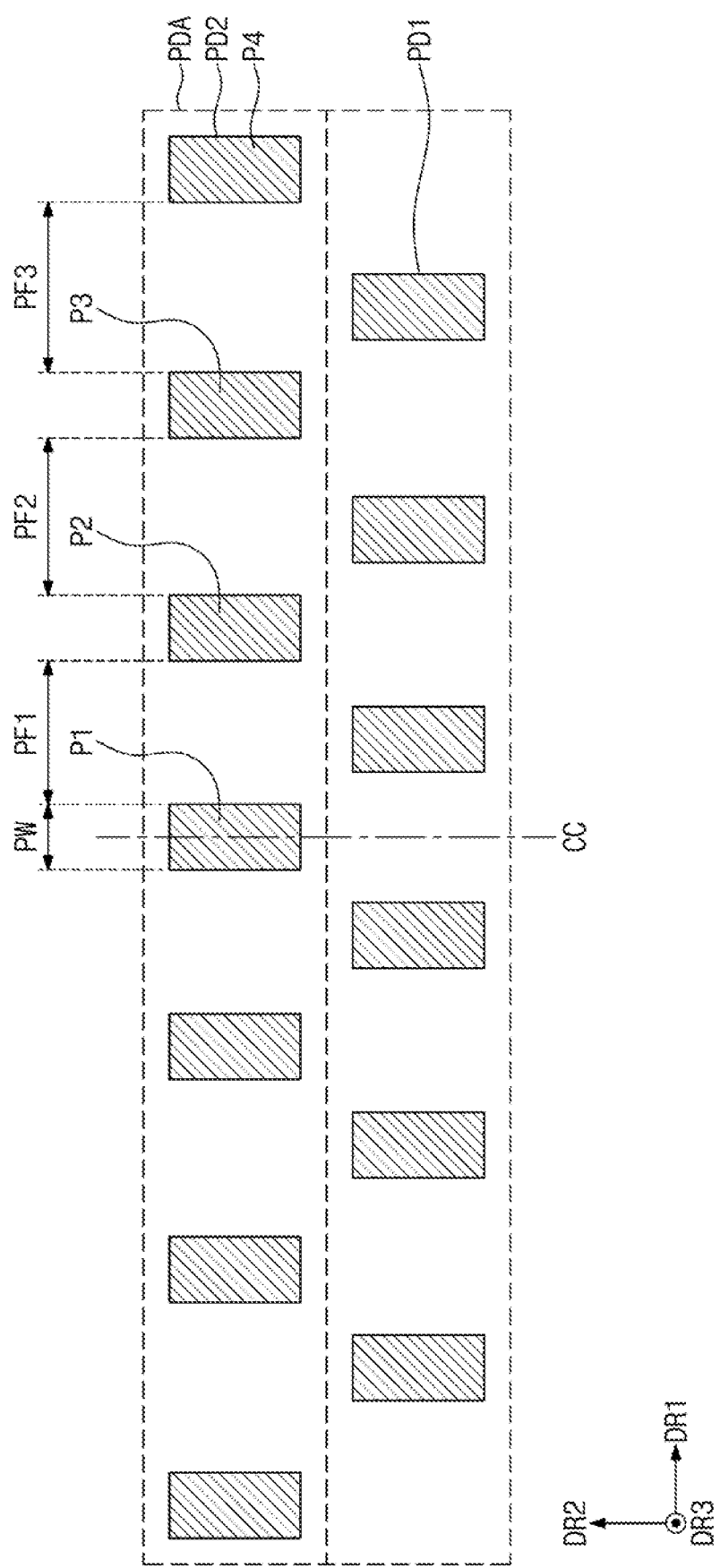
FIG. 5A is a plan view illustrating a display pad area of the display panel according to an exemplary embodiment of the inventive concept.
Figure 5B:
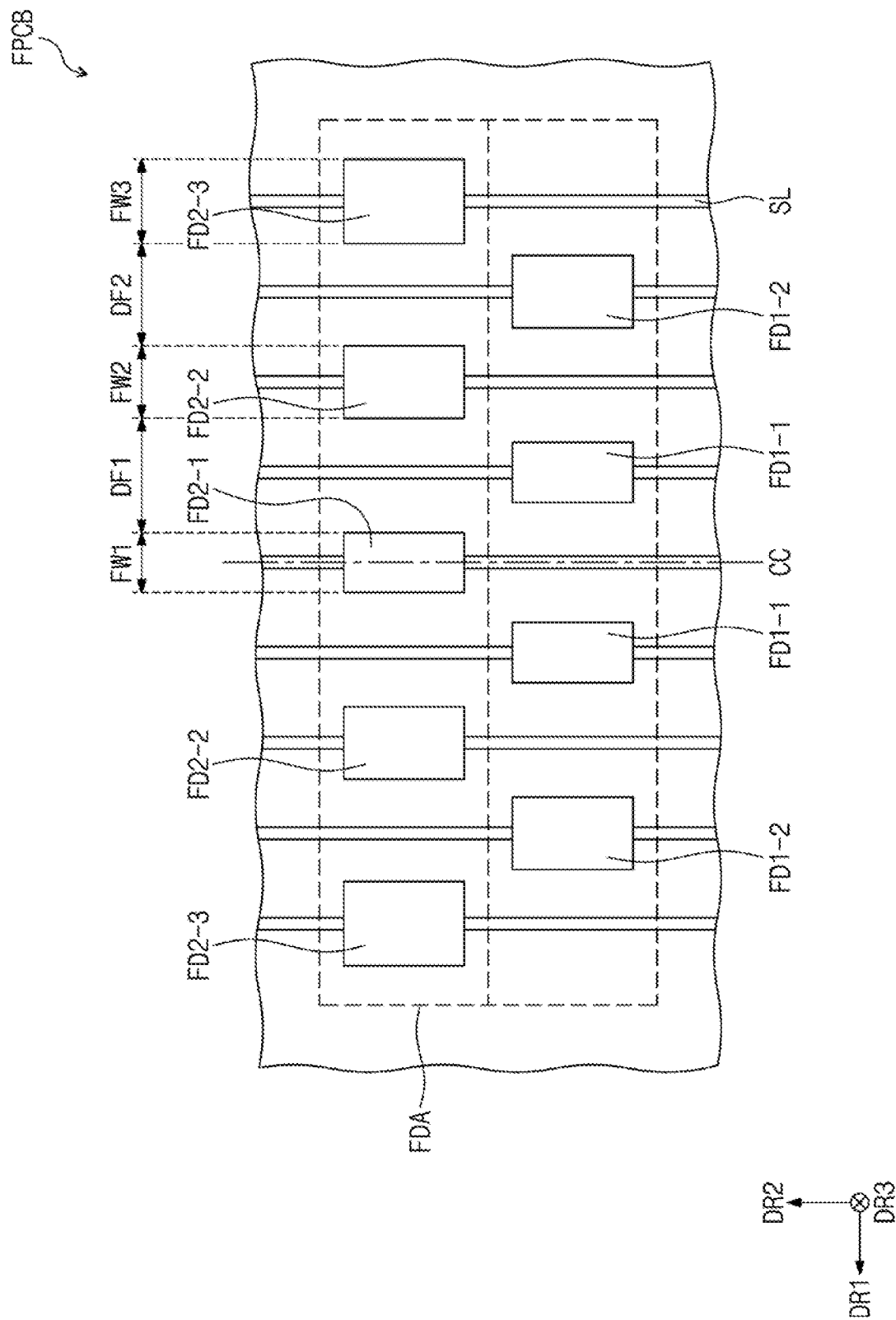
FIG. 5B is a plan view illustrating a substrate pad area of a flexible circuit board according to an exemplary embodiment of the inventive concept.
Figure 6:
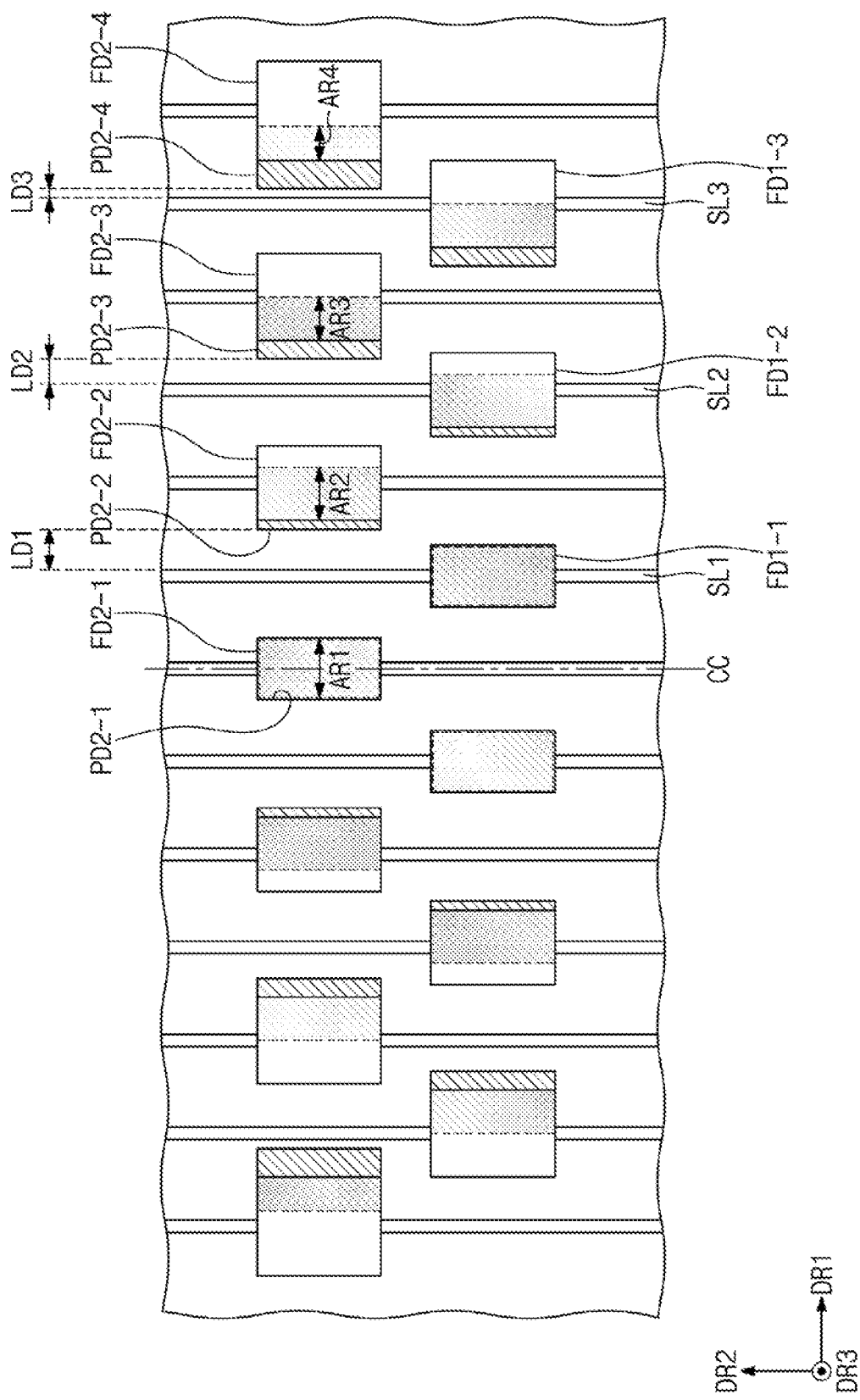
FIG. 6 is a plan view illustrating display pads and substrate pads according to an exemplary embodiment of the inventive concept.

FIG. 5A is a plan view illustrating the display pad area of the display panel according to an embodiment of the inventive concept. FIG. 5B is a plan view illustrating the substrate pad area of the flexible circuit board according to an embodiment of the inventive concept. FIG. 6 is a plan view illustrating the display pads and the substrate pads according to an embodiment of the inventive concept. The same or similar elements as those in FIGS. 1 to 4B will be designated by the same or similar reference numerals, respectively, and to the extent that a description of an element has been omitted, it may be assumed that the description is at least similar to that of corresponding elements that have been described elsewhere in the instant specification.

In FIG. 5A, the display pad area PDA contained in the display panel DP is illustrated by a dotted line, and the display pads PD1 and PD2 contained in the display pad area PDA are exemplarily illustrated.

In an embodiment of the inventive concept, two pad rows PD1 and PD2 may be disposed on each of display pad areas PDA. Each of the two pad rows PD1 and PD2 may include a plurality of display pads arranged in the first direction DR1. A first display pad row PD1 may be spaced apart from a second display pad row PD2 in the second direction DR2 crossing the first direction DR1.

The display pads contained in each of the two pad rows PD1 and PD2 may have a same width as each other. For example, the display pads may have a same width PW as each other in the first direction DR1.

According to an embodiment of the inventive concept, with respect to a central axis CC of the display pad area PDA, a spaced distance between neighboring display pads of the two pad rows PD1 and PD2 may gradually increase by an equivalent interval in a direction away from the central axis CC along the first direction DR1. According to an embodiment of the inventive concept, a spaced distance between neighboring display pads of the first display pad row PD1 may gradually increase by an equivalent interval in a direction away from the central axis CC along the first direction DR1. A spaced distance between neighboring display pads of the second display pad row PD2 may gradually increase by an equivalent interval in the direction away from the central axis CC along the first direction DR1.

According to an exemplary embodiment of the inventive concept, a spaced distance PF1 may be a distance between a first display pad P1 and a second display pad P2 in the first direction DR1. A spaced distance PF2 may be a distance between the second display pad P2 and a third display pad P3 in the first direction DR. A spaced distance PF3 may be a distance between the third display pad P3 and a fourth display pad P4 in the first direction DR1. The spaced distance PF1 may be the same as a difference between the spaced distance PF2 and the spaced distance PF3.

According to an exemplary embodiment of the inventive concept, the spaced distance PF2 in the first direction DR1 may be larger than the space distance PF1. In addition, the spaced distance PF3 in the first direction DR1 may be larger than the space distance PF2.

Thus, according to an embodiment of the inventive concept, a spaced distance between neighboring display pads of the display pads contained in each of the two pad rows PD1 and PD2 may gradually increase by an equivalent interval in the direction away from the central axis CC along the first direction DR1.

According to an embodiment of the inventive concept, a difference between spaced distances between neighboring display pads of the first display pads contained in the first pad row PD1 may be different from a difference between spaced distances between neighboring display pads of the second display pads contained in the second pad row PD2. However, embodiments of the inventive concept are not limited thereto.

In FIG. 5B, the substrate pad area FDA contained in the flexible circuit board FPCB is illustrated by a dotted line, and the substrate pads FD1-1, FD1-2, FD2-1, FD2-2, and FD2-3 contained in the substrate pad area FDA and the substrate signal lines SL connected thereto, respectively, are exemplarily illustrated.

According to an exemplary embodiment of the inventive concept, the display panel may include a plurality of first display pads and a plurality of second display pads. Each of the plurality of first display pads may at least partially overlap corresponding substrate pad of the plurality of first substrate pads, respectively, and each of the plurality of second display pads may at least partially overlap corresponding substrate pad of the plurality of second substrate pads, respectively.

In an embodiment of the inventive concept, each of the substrate pad areas FDA may include first substrate pads FD1-1 and FD1-2 connected to the first pad row PD1 of the display pad area PDA and second substrate pads FD2-1, FD2-2, and FD2-3 connected to the second pad row PD2 of the display pad area PDA. Thus, each of the first display pads may at least partially overlap corresponding first substrate pads FD1-1 and FD1-2, respectively, and each of the second display pads may at least partially overlap corresponding second substrate pads FD2-1, FD2-2, and FD2-3, respectively.

The first substrate pads FD1-1 and FD1-2 being symmetric with respect to the central axis CC of the substrate pad area FDA among the first substrate pads FD1-1 and FD1-2 are designated by the same reference numerals. Further, the second substrate pads FD2-1, FD2-2, and FD2-3 being symmetric with respect to the central axis CC among the second substrate pads FD2-1, FD2-2, and FD2-3 are designated by the same reference numerals.

According to an exemplary embodiment of the inventive concept, each of the first substrate pads FD1-1 and FD1-2 and the second substrate pads FD2-1, FD2-2, and FD2-3 may be arranged in the first direction DR1. The plurality of first substrate pads FD1-1 and FD1-2 and the plurality of second substrate pads FD2-1, FD2-2, and FD2-3 may be spaced apart from each other in the second direction DR2. The first substrate pads FD1-1 and FD1-2 and the second substrate pads FD2-1, FD2-2, and FD2-3 may be disposed alternately to each other. According to an exemplary embodiment of the inventive concept, each of the plurality of second substrate pads may be disposed alternately to each of the plurality of first substrate pads.

According to an embodiment of the inventive concept, each of the first substrate pads FD1-1 and FD1-2 and the second substrate pads FD2-1, FD2-2, and FD2-3 may have a width in the first direction DR1, which gradually increases by an equivalent interval in a direction away from the central axis CC along the first direction DR1.

Thus, unlike embodiments of the inventive concept as illustrated in FIG. 5A, in which the "spaced distance" between neighboring display pads increases by an equivalent interval in the direction away from the central axis CC along the first direction DR1, the "width" of each of the substrate pads contained in the flexible circuit board FPCB may increase by an equivalent interval in the direction away from the central axis CC along the first direction DR1

According to an exemplary embodiment of the inventive concept, a first substrate pad FD2-1 may have a first width FW1 in the first direction DR1, a second substrate pad FD2-2 may have a second width FW2 in the first direction DR1, and a third substrate pad FD2-3 may have a third width FW3 in the first direction DR1. A difference between the first width FW1 and the second width FW2 may be the same as a difference between the third width FW3 and the fourth width FW4.

According to an embodiment of the inventive concept, a spaced distance between neighboring substrate pads may gradually decrease in a direction away from the central axis CC along the first direction DR1.

In an embodiment, a spaced distance DF1 between the first substrate pad FD2-1 and the second substrate pad FD2-2 may be greater than a spaced distance DF2 between the second substrate pad FD2-2 and the third substrate pad FD2-3.

According to an embodiment of the inventive concept, each of the substrate pads disposed at a right side with respect to the central axis CC may have a width and an arrangement relationship that are symmetric to each of the substrate pads disposed at a left side with respect to the central axis CC.

FIG. 6 is a plan view illustrating a state in which the display pads (refer to FIG. 5A) and the substrate pads (refer to FIG. 5B) are coupled. The display pads are shaded for convenience of description, and an area in which the display pads and the substrate pads overlap each other is relatively light-shaded.

As described in FIG. 4B, according to an embodiment of the inventive concept, bonding between the display pads and the substrate pads may be performed such that an anisotropic conductive film (ACF) is disposed between the display pads and the substrate pads, and the anisotropic conductive film (ACF) may bond the display pads and the substrate pads through a thermal compression process. During this process, a movement phenomenon in which the substrate pads of the flexible circuit board FPCB, which is relatively flexible, move in a direction from the central axis CC along the first direction DR1 due to the thermal compression may occur.

Thus, although the spaced distance between the neighboring substrate pads gradually decreases in the direction from the central axis CC along the first direction DR1, and the spaced distance between the display pads gradually increases in the same manner in the direction from the central axis CC along the first direction DR1, a misalignment between the substrate pads and the display pads may occur due to the movement phenomenon caused by the thermal compression.

According to an exemplary embodiment of the inventive concept, as the spaced distance between the display pads increases in a same manner as the substrate pads in the direction from the central axis CC along the first direction, and the width of each of the substrate pads increases with an equal interval in the direction from the central axis CC along the first direction, the misalignment due to the movement phenomenon of the substrate pads during the thermal compression may be compensated. Thus, the display apparatus DD having electrical coupling of increased performance is provided.

According to an embodiment of the inventive concept, although the spaced distance between the display pads increases in a same manner as the substrate pads in the direction from the central axis CC along the first direction, and the width of each of the substrate pads increases with an equal interval in the direction from the central axis CC along the first direction, an area in which the display pads overlap corresponding substrate pads, respectively, due to the movement phenomenon of the substrate pads caused by the thermal compression may gradually decrease in the direction away from the central axis CC along the first direction.

According to an embodiment of the inventive concept, in the first direction DR1, width of an area in which each of a plurality of first display pads overlaps corresponding substrate pad of a plurality of first substrate pad may decrease in the direction away from the central axis CC along the first direction. In addition, in the first direction DR1, width of an area in which each of a plurality of second display pads overlaps corresponding substrate pad of a plurality of second substrate pad may decrease in the direction away from the central axis CC along the first direction.

For example, the first display pad PD2-1 and the first substrate pad FD2-1 may include a first overlap area AR1 on a plane, the second display pad PD2-2 and the second substrate pad FD2-2 may include a second overlap area AR2 on the plane, the third display pad PD2-3 and the third substrate pad FD2-3 may include a third overlap area AR3 on the plane, and the fourth display pad PD2-4 and the fourth substrate pad FD2-4 may include a fourth overlap area AR4 on the plane. According to an embodiment of the inventive concept, the first to fourth overlap areas AR1, AR2, AR3, AR4 may gradually decrease in an order from the first overlap area AR1 to the fourth overlap area AR4 in the first direction DR1. According to an embodiment of the inventive concept, as the width of each of the substrate pads increases with an equivalent interval in the direction from the central axis CC along the first direction, the overlap area, which gradually decreases in the direction from the central axis CC along the first direction, may be compensated.

According to an embodiment of the inventive concept, a spaced distance between the substrate signal line and the display pad adjacent thereto may gradually decrease in the direction away from the central axis CC along the first direction by the movement phenomenon of the substrate pads caused by the thermal compression.

For example, a first substrate signal line SL1 connected with a fifth substrate pad FD1-1 and the second display pad PD2-2 may have a first spaced distance LD1 therebetween. A second substrate signal line SL2 connected with a sixth substrate pad FD1-2 and the third display pad PD2-3 may have a second spaced distance LD2 therebetween. A third substrate signal line SL3 connected with a seventh substrate pad FD1-3 and the fourth display pad PD2-4 may have a third spaced distance LD3 therebetween. According to an embodiment of the inventive concept, when the third spaced distance LD3 is a spaced distance between a substrate signal line and a display pad, which are disposed at an outermost portion, the third spaced distance LD3 may be equal to or greater than about 5 μm. When the third spaced distance LD3 is less than about 5 μm, a defect due to an electrical interference between the substrate signal line and the display pad may be produced.

Figure 7:
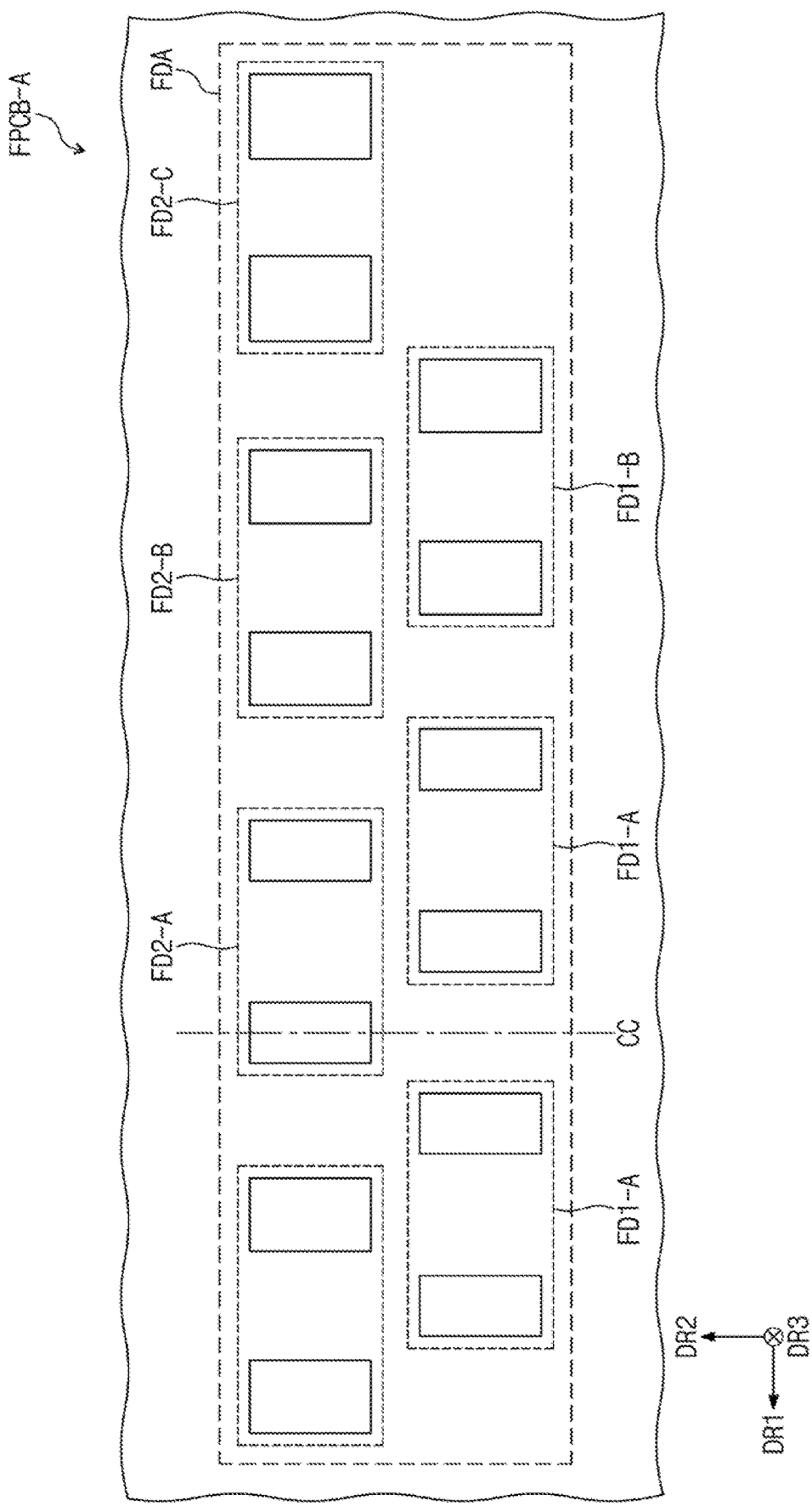
FIG. 7 is a plan view illustrating a display pad area of a display panel according to an exemplary embodiment of the inventive concept.

FIG. 7 is a plan view illustrating a display pad area of a display panel according to an embodiment of the inventive concept. The same or similar elements as those in FIGS. 1 to 6 will be designated by the same or similar reference numerals, respectively, and to the extent that a description of an element has been omitted, it may be assumed that the description is at least similar to that of corresponding elements that have been described elsewhere in the instant specification.

Referring to FIG. 7, in an embodiment of the inventive concept, a flexible circuit board FPCB-A includes a plurality of pad pairs FD1-A, FD1-B, FD2-A, FD2-B, and FD2-C. The plurality of pad pairs FD1-A, FD1-B, FD2-A, FD2-B, and FD2-C may be symmetric to each other with respect to a central axis CC.

According to an embodiment of the inventive concept, substrate pads contained in the plurality of pad pairs FD1-A, FD1-B, FD2-A, FD2-B, and FD2-C may have same widths among each other in the first direction DR1.

Each of pad pairs arranged in a same row (e.g., first row pad pairs FD1-A and FD1-B) may have a width in the first direction DR1, which gradually increases in a direction away from the central axis CC along the first direction. Also, each of second pad pairs FD2-A, FD2-B, and FD2-C may have a width in the first direction DR1, which gradually increases in the direction away from the central axis CC along the first direction. According to some embodiments of the inventive concept, a width of the pad pair FD1-B may be larger than a width of the pad pair FD1-A in the first direction DR1. Similarly, a width of the pad pair FD2-C may be larger than a width of the pad pair FD2-B in the first direction. Similarly, a width of the pad pair FD2-B may be larger than a width of the pad pair FD2-A in the first direction.

Also, a spaced distance between substrate pads contained in each of the pad pairs FD1-A, FD1-B, FD2-A, FD2-B, and FD2-C may gradually decrease in the direction away from the central axis CC along the first direction. According to an embodiment of the inventive concept, a space distance between two substrate pads contained in the pad pair FD-2A may be larger than a space distance between two substrate pads contained in the pad pair FD-2B. Similarly, a space distance between two substrate pads contained in the pad pair FD-2B may be larger than a space distance between two substrate pads contained in the pad pair FD-2C.

According to an exemplary embodiment of the inventive concept, the spaced distance between the display pads may gradually increase in a same manner as the substrate pads in the direction from the central axis along one direction, and the widths of the substrate pads may increase with the equivalent interval in the direction from the central axis along the one direction. Thus, the misalignment due to the movement phenomenon of the substrate pads caused by the thermal compression may be compensated. Therefore, the display device having electrical coupling of increased performance is provided.

While the inventive concept has been particularly shown and described with reference to the exemplary embodiments thereof, it will be understood by one of ordinary skill in the art that variations in form and detail may be made therein without departing from the spirit and scope of the inventive concept.

What is claimed is:

1. A display apparatus comprising:
a flexible circuit board comprising a plurality of first substrate pads arranged in a first direction and a plurality of second substrate pads arranged in the first direction, wherein the plurality of second substrate pads is spaced apart from the plurality of first substrate pads in a second direction crossing the first direction, and each of the plurality of second substrate pads is disposed alternately to each of the plurality of first substrate pads;
a main circuit board connected to the flexible circuit board; and
a display panel comprising a plurality of first display pads and a plurality of second display pads, wherein the plurality of first display pads is connected to the main circuit board through the flexible circuit board and each of the plurality of first display pads at least partially overlaps corresponding substrate pad of the plurality of first substrate pads, respectively, and each of the plurality of second display pads at least partially overlaps corresponding substrate pad of the plurality of second substrate pads, respectively,
wherein widths of the plurality of first substrate pads and the plurality of second substrate pads in the first direction increase by an equivalent interval in a direction away from a central axis of the flexible circuit board along the first direction, and
wherein spaced distances between neighboring display pads of the plurality of first display pads in the first direction increase by an equivalent interval in the direction away from the central axis along the first direction, and spaced distances between neighboring display pads of the plurality of second display pads in the first direction increase by the equivalent interval in the direction away from the central axis along the first direction.

2. The display apparatus of claim 1, wherein in the first direction, width of an area in which each of the plurality of first display pads overlaps corresponding substrate pad of the plurality of first substrate pads decreases in the direction away from the central axis along the first direction, and
wherein in the first direction, width of an area in which each of the plurality of second display pads overlaps corresponding second substrate pad of the plurality of second substrate pads decreases in the direction away from the central axis along the first direction.

3. The display apparatus of claim 1, wherein in the first direction, widths of the plurality of first substrate pads and the plurality of second substrate pads are symmetric with respect to the central axis of the flexible circuit board.

4. The display apparatus of claim 1, wherein spaced distances between neighboring substrate pads of the plurality of first substrate pads decrease in the direction away from the central axis along the first direction, and
wherein spaced distances between neighboring substrate pads of the plurality of second substrate pads decrease in the direction away from the central axis along the first direction.

5. The display apparatus of claim 1, wherein in the first direction, widths of the plurality of first display pads and the plurality of second display pads are the same as each other.

6. The display apparatus of claim 1, wherein in the first direction, differences between widths of neighboring substrate pads of the plurality of first substrate pads are the same as each other, and
wherein in the first direction, differences between widths of neighboring substrate pads of the plurality of second substrate pads are the same as each other.

7. The display apparatus of claim 1, wherein each of the plurality of first display pads has a same width in the first direction, and
wherein each of the plurality of second display pads has a same width in the first direction.

8. The display apparatus of claim 1, wherein the flexible circuit board comprises an insulation layer, a plurality of substrate signal lines disposed on the insulation layer, and a solder resist layer in which openings configured to expose a portion of the plurality of substrate signal lines are disposed,
wherein each of the plurality of substrate signal lines is connected to corresponding substrate pad of the plurality of first substrate pads or corresponding substrate pad of the plurality of second substrate pads through corresponding openings.

9. The display apparatus of claim 8, wherein a distance between a substrate signal line of the plurality of substrate signal lines and a display pad adjacent thereto decreases in the direction away from the central axis along the first direction.

10. The display apparatus of claim 1, wherein each of the plurality of first substrate pads is connected to corresponding display pad of the plurality of first display pads by an anisotropic conductive film, and
wherein each of the plurality of second substrate pads is connected to corresponding display pad of the plurality of second display pads by another anisotropic conductive film.

11. A display apparatus comprising:
a flexible circuit board comprising a plurality of first substrate pads arranged in a first direction and a plurality of second substrate pads arranged in the first direction, wherein the plurality of second substrate pads is spaced apart from the plurality of first substrate pads in a second direction crossing the first direction, and each of the plurality of second substrate pads is disposed alternately to each of the plurality of first substrate pads;
a main circuit board connected to the flexible circuit board; and
a display panel comprising a plurality of first display pads and a plurality of second display pads, wherein the plurality of first display pads is connected to the main circuit board through the flexible circuit board and each of the plurality of first display pads at least partially overlaps corresponding substrate pad of the plurality of first substrate pads, respectively, and each of the plurality of second display pads at least partially overlaps corresponding substrate pad of the plurality of second substrate pads, respectively, wherein in the first direction, width of an area in which each of the plurality of first display pads overlaps the corresponding substrate pad of the plurality of first substrate pads, respectively, decreases in a direction away from a central axis of the flexible circuit board along the first direction, and wherein in the first direction, width of an area in which each of the plurality of second display pads overlaps the corresponding substrate pad of the plurality of second substrate pads, respectively, decreases in the direction away from the central axis of the flexible circuit board along the first direction.

12. The display apparatus of claim 11, wherein in the first direction, widths of the plurality of first substrate pads and the plurality of second substrate pads increase by an equivalent interval in the direction away from the central axis of the flexible circuit board along the first direction.

13. The display apparatus of claim 11, wherein in the first direction, widths of the plurality of first substrate pads and the plurality of second substrate pads are symmetric with respect to the central axis of the flexible circuit board.

14. The display apparatus of claim 11, wherein spaced distances between neighboring substrate pads of the plurality of first substrate pads decrease in the direction away from the central axis along the first direction, and wherein spaced distances between neighboring substrate pads of the plurality of second substrate pads decrease in the direction away from the central axis along the first direction.

15. The display apparatus of claim 11, wherein in the first direction, spaced distances between neighboring display pads of the plurality of first display pads increase by an equivalent interval in a direction away from the central axis along the first direction, and wherein in the first direction, spaced distances between neighboring display pads of the plurality of second display pads increase by the equivalent interval in a direction away from the central axis along the first direction.

16. The display apparatus of claim 11, wherein in the first direction, differences between widths of neighboring substrate pads of the plurality of first substrate pads are the same as each other, and wherein in the first direction, differences between widths of neighboring substrate pads of the plurality of second substrate pads are the same as each other.

17. The display apparatus of claim 11, wherein each of the plurality of first display pads has a same width in the first direction, and each of the plurality of second display pads has a same width in the first direction.

18. The display apparatus of claim 11, wherein the flexible circuit board comprises an insulation layer, a plurality of substrate signal lines disposed on the insulation layer, and a solder resist layer in which openings configured to expose a portion of the plurality of substrate signal lines are disposed, wherein each of the plurality of substrate signal lines is connected to corresponding substrate pad of the plurality of first substrate pads or corresponding substrate pad of the plurality of second substrate pads through corresponding openings.

19. The display apparatus of claim 18, wherein a distance between a substrate signal line and a display pad adjacent thereto decreases in the direction away from the central axis along the first direction.

20. The display apparatus of claim 11, wherein each of the plurality of first substrate pads is connected to corresponding display pad of the plurality of first display pads by an anisotropic conductive film, and wherein each of the plurality of second substrate pads is connected to corresponding display pad of the plurality of second display pads by another anisotropic conductive film.

* * * * *